United States Patent — Liao et al.

(10) Patent No.: US 12,532,537 B2
(45) Date of Patent: Jan. 20, 2026

(54) SEMICONDUCTOR DEVICE WITH A DEEP TRENCH ISOLATION STRUCTURE AND BURIED LAYERS FOR REDUCING SUBSTRATE LEAKAGE CURRENT AND AVOIDING LATCH-UP EFFECT, AND FABRICATION METHOD THEREOF

(71) Applicant: Vanguard International Semiconductor Corporation, Hsinchu (TW)

(72) Inventors: Chih-Cherng Liao, Hsinchu (TW); Chung-Ren Lao, Taichung (TW); Hsing-Chao Liu, Hsinchu County (TW); Chun-Wei Li, Taipei (TW); Hsueh-Chun Liao, Keelung (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 617 days.

(21) Appl. No.: 17/879,789

(22) Filed: Aug. 3, 2022

(65) Prior Publication Data

US 2024/0047460 A1 Feb. 8, 2024

(51) Int. Cl.
*H10D 84/85* (2025.01)
*H01L 21/762* (2006.01)
(Continued)

(52) U.S. Cl.
CPC ..... *H10D 84/854* (2025.01); *H01L 21/76267* (2013.01); *H01L 21/76283* (2013.01);
(Continued)

(58) Field of Classification Search
CPC ............... H01L 21/74; H01L 21/76224; H01L 21/76283; H01L 21/76267; H01L 21/761;
(Continued)

(56) References Cited

U.S. PATENT DOCUMENTS 6,979,875 B2  12/2005  Kwon
8,304,827 B2  11/2012  Nakamura
(Continued)

FOREIGN PATENT DOCUMENTS

CN  103011048 A  4/2013
CN  104518031 A  4/2015
(Continued)

*Primary Examiner* — William B Partridge
*Assistant Examiner* — Ilker Ozden
(74) *Attorney, Agent, or Firm* — Winston Hsu

(57) ABSTRACT

A semiconductor device includes a first buried layer and a second buried layer both have a first conductivity type and are disposed in a substrate, where the second buried layer is disposed on the first buried layer. A first well region has the first conductivity type and is disposed above the second buried layer. A second well region has a second conductivity type and is adjacent to the first well region. A deep trench isolation structure is disposed in the substrate and surrounds the first and second well regions, where the bottom surface of the deep trench isolation structure is lower than the bottom surface of the first buried layer. A source region is disposed in the second well region. A drain region is disposed in the first well region. A gate electrode is disposed on the first and second well regions.

17 Claims, 10 Drawing Sheets

(51) Int. Cl.
  *H10D 84/01* (2025.01)
  *H10D 84/03* (2025.01)
(52) U.S. Cl.
  CPC ..... *H10D 84/0188* (2025.01); *H10D 84/0191* (2025.01); *H10D 84/038* (2025.01)
(58) Field of Classification Search
  CPC .. H10D 84/854; H10D 62/10; H10D 84/0188; H10D 84/0191; H10D 84/038; H10D 30/0221; H10D 30/603; H10D 30/65
  See application file for complete search history.

(56) References Cited

U.S. PATENT DOCUMENTS

| | | | |
|---|---|---|---|
| 8,652,930 B2 | 2/2014 | Yang | |
| 10,770,542 B2 | 9/2020 | Choi | |
| 2001/0038125 A1* | 11/2001 | Ohyanagi | H10D 86/201 |
| | | | 257/E21.418 |
| 2006/0063389 A1* | 3/2006 | Chang | H01L 21/763 |
| | | | 257/E21.549 |
| 2008/0166849 A1 | 7/2008 | Yang | |
| 2011/0062517 A1* | 3/2011 | Yoshinaga | H10D 30/603 |
| | | | 257/337 |
| 2011/0215373 A1* | 9/2011 | Kwon | H10D 84/151 |
| | | | 257/E29.198 |
| 2015/0102455 A1* | 4/2015 | Zhang | H10D 62/115 |
| | | | 438/200 |
| 2015/0364576 A1 | 12/2015 | Zhang | |
| 2016/0372429 A1* | 12/2016 | Cho | H10D 62/371 |
| 2017/0148873 A1* | 5/2017 | Kim | H10D 62/129 |
| 2017/0243915 A1* | 8/2017 | Chou | H10D 84/038 |
| 2019/0088740 A1* | 3/2019 | Tsuchiko | H01L 21/761 |
| 2019/0148368 A1* | 5/2019 | Agam | |
| 2020/0194581 A1* | 6/2020 | Kan | H10D 30/603 |
| 2021/0013192 A1 | 1/2021 | Mallikarjunaswamy | |
| 2021/0134655 A1* | 5/2021 | Shih | H10D 86/01 |

FOREIGN PATENT DOCUMENTS

| | | |
|---|---|---|
| TW | I331400 | 10/2010 |
| TW | I726247 B | 5/2021 |

\* cited by examiner

SEMICONDUCTOR DEVICE WITH A DEEP TRENCH ISOLATION STRUCTURE AND BURIED LAYERS FOR REDUCING SUBSTRATE LEAKAGE CURRENT AND AVOIDING LATCH-UP EFFECT, AND FABRICATION METHOD THEREOF

BACKGROUND OF THE INVENTION

1. Field of the Invention

The present disclosure relates generally to semiconductor technology, and more particularly to semiconductor devices including an isolation structure to prevent the substrate leakage current and fabrication methods thereof.

2. Description of the Prior Art

A semiconductor device usually includes p-type well regions and n-type well regions. The semiconductor device with a staggered structure of p-type well regions and n-type well regions will produce latch-up effect due to a parasitic bipolar junction transistor (BJT), thereby reducing the reliability of the semiconductor device. A conventional method to prevent latch-up effect is to increase the distance between PN junctions, or to form an isolation structure at the PN junction. When the operating voltage of the semiconductor device becomes increasingly high, the required distance between the PN junctions is also increased, or the size of the isolation structure at the PN junction also needs to become larger, thereby causing the increase in the size of the semiconductor device.

However, in the development of electronic products, the size of the semiconductor device needs to be reduced. For conventional methods for preventing latch-up effect, the operating voltage of the semiconductor device cannot be enhanced without increasing the size of the semiconductor device. Therefore, the industry needs a semiconductor device which is able to overcome the above problems.

SUMMARY OF THE INVENTION

In view of this, the present disclosure provides semiconductor devices and fabrication methods thereof, which include an isolation structure to prevent substrate leakage current. The semiconductor devices reduce the characteristics of parasitic bipolar transistor without increasing the size of the semiconductor devices while the operating voltage thereof is increased, so as to reduce substrate leakage current and avoid latch-up effect. Therefore, the breakdown voltage and the reliability of semiconductor devices are improved. Moreover, the semiconductor devices of the present disclosure achieve isolation effect similar to semiconductor devices using a silicon-on-insulator (SOI) substrate.

According to an embodiment of the present disclosure, a semiconductor device is provided and includes a substrate, a first buried layer, a second buried layer, a first well region, a second well region, a deep trench isolation structure, a source region, a drain region, and a gate electrode. The first buried layer has a first conductivity type and is disposed in the substrate. The second buried layer has the first conductivity type and is disposed on the first buried layer. The first well region has the first conductivity type and is disposed above the second buried layer. The second well region has a second conductivity type opposite to the first conductivity type, and is adjacent to the first well region. The deep trench isolation structure is disposed in the substrate and surrounds the first well region and the second well region. The bottom surface of the deep trench isolation structure is lower than the bottom surface of the first buried layer. The source region is disposed in the second well region. The drain region is disposed in the first well region. In addition, the gate electrode is disposed on the first well region and the second well region.

According to an embodiment of the present disclosure, a method of fabricating a semiconductor device is provided and includes the following steps. A substrate is provided and a first buried layer is formed in the substrate, where the first buried layer has a first conductivity type. A second buried layer is formed on the first buried layer and has the first conductivity type. A first well region is formed above the second buried layer and has the first conductivity type. A second well region is formed adjacent to the first well region and has a second conductivity type opposite to the first conductivity type. A deep trench isolation structure is formed in the substrate and surrounds the first well region and the second well region, where the bottom surface of the deep trench isolation structure is lower than the bottom surface of the first buried layer. A source region is formed in the second well region and a drain region is formed in the first well region. In addition, a gate electrode is formed on the first well region and the second well region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
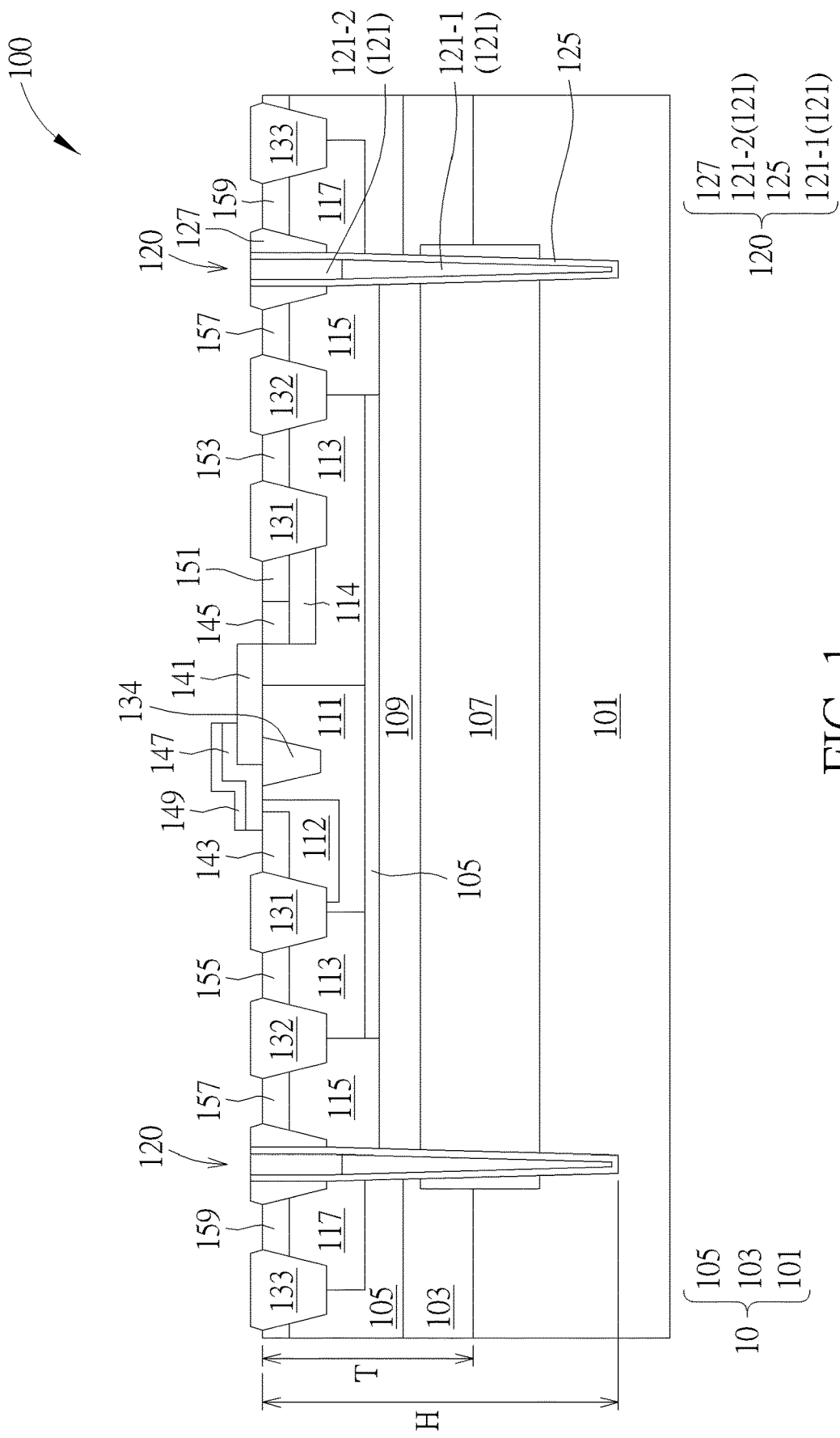
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure relates to a semiconductor device including an isolation structure to prevent substrate leakage current and a fabrication method thereof. The semiconductor device includes a first buried layer, a second buried layer and a deep trench isolation structure disposed in a substrate to reduce the characteristics of parasitic bipolar transistor in the semiconductor device, thereby reducing substrate leakage current and preventing latch-up effect. The semiconductor devices of the present disclosure achieve an isolation effect similar to the isolation effect achieved by semiconductor devices using a SOI substrate, thereby saving the cost of fabricating the semiconductor devices and avoiding the poor thermal conductivity caused by the use of the SOI substrate. Moreover, when the semiconductor devices of the present disclosure are applied with a high operating voltage, substrate leakage current is effectively reduced without increasing the size of the semiconductor devices, thereby enhancing the breakdown voltage and improving the reliability of the semiconductor devices.

FIG. 1 is a schematic cross-sectional view of a semiconductor device according to an embodiment of the present disclosure. As shown in FIG. 1, in one embodiment, a semiconductor device 100 includes a substrate 10. The substrate 10 includes a semiconductor substrate 101, a first epitaxial layer 103 and a second epitaxial layer 105. The first epitaxial layer 103 is disposed on the semiconductor substrate 101, and the second epitaxial layer 105 is disposed on the first epitaxial layer 103. The material of the semiconductor substrate 101 includes silicon, silicon carbide (SiC), aluminum nitride (AlN), gallium nitride (GaN) or other suitable semiconductor materials. In the embodiments, the first epitaxial layer 103 and the second epitaxial layer 105 are semiconductor epitaxial layers having a first conductivity type, a second conductivity type, or a combination thereof, where the first conductivity type is n-type, and the second conductivity type is p-type. In one embodiment, the semiconductor substrate 101, the first epitaxial layer 103 and the second epitaxial layer 105 all are semiconductor epitaxial layers having the second conductivity type (such as p-type silicon epitaxial layers). In addition, according to the embodiments of the present disclosure, the semiconductor device 100 further includes a first buried layer 107 having the first conductivity type, such as an n-type first buried layer (NBL1). The first buried layer 107 is disposed in the substrate 10, and located in the semiconductor substrate 101 and the first epitaxial layer 103. The semiconductor device 100 further includes a second buried layer 109 having the first conductivity type, such as an n-type second buried layer (NBL2). The second buried layer 109 is disposed in the substrate 10 and located in the first epitaxial layer 103 and the second epitaxial layer 105. According to the embodiments of the present disclosure, the doping concentration of the second buried layer 109 may be lower than or equal to the doping concentration of the first buried layer 107, so that the electrical properties of each doped region and each well region in the second epitaxial layer 105 are not affected by the second buried layer 109. Moreover, in some embodiments, the thickness of the first buried layer 107 is greater than the thickness of the second buried layer 109, for example, the thickness of the first buried layer 107 may be 1.2 times to 2 times the thickness of the second buried layer 109. Therefore, the first buried layer 107 located below the second buried layer 109 and having a larger thickness and a higher doping concentration provides a good isolation effect for the semiconductor device 100 to reduce substrate leakage current.

Still referring to FIG. 1, the semiconductor device 100 further includes a first well region 111 having the first conductivity type, such as a high-voltage n-well (HVNW).

The first well region 111 is disposed in the second epitaxial layer 105 of the substrate 10 and above the second buried layer 109. In addition, a second well region 113 having a second conductivity type, such as a high-voltage p-well (HVPW), is also disposed in the second epitaxial layer 105 of the substrate 10. The second well region 113 includes two portions adjacent to two opposite sides of the first well region 111 respectively. Moreover, the semiconductor device 100 further includes a third well region 115 having the first conductivity type, such as a deep high-voltage n-well (DHVNW). The third well region 115 is disposed in the second epitaxial layer 105 of the substrate 10 and surrounds the first well region 111 and the second well region 113 in a top view. The bottom surface of the third well region 115 is in contact with the top surface of the second buried layer 109, and the bottom surface of the third well region 115 is lower than both the bottom surfaces of the first well region 111 and the second well region 113. In some embodiments, the bottom surface of the first well region 111 and the bottom surface of the second well region 113 may be on the same plane. There is a distance between the bottom surface of the first well region 111 and the top surface of the second buried layer 109. There is also a distance between the bottom surface of the second well region 113 and the top surface of the second buried layer 109. The first well region 111 and the second buried layer 109 are separated by a portion of the second epitaxial layer 105. Also, the second well region 113 and the second buried layer 109 are separated by a portion of the second epitaxial layer 105. The first well region 111 is vertically separated from the second buried layer 109, thereby preventing current from flowing from the first well region 111 into the second buried layer 109.

According to the embodiments of the present disclosure, the semiconductor device 100 includes a deep trench isolation structure 120 disposed in the substrate 10 and passing through the second epitaxial layer 105, the second buried layer 109, the first epitaxial layer 103 and the first buried layer 107 until a position in depth of the semiconductor substrate 101. The deep trench isolation structure 120 is extended downward from the top surface of the second epitaxial layer 105 into the semiconductor substrate 101, and the bottom surface of the deep trench isolation structure 120 is lower than the bottom surface of the first buried layer 107. In addition, as shown in FIG. 1, in one embodiment, the deep trench isolation structure 120 surrounds the first well region 111, the second well region 113 and the third well region 115 in a top view, where the third well region 115 is located between the first well region 111 and the deep trench isolation structure 120, and also between the second well region 113 and the deep trench isolation structure 120. In some embodiments, the deep trench isolation structure 120 includes a core portion 121, a liner 125 and a peripheral portion 127. The core portion 121 includes a lower portion 121-1 and an upper portion 121-2. The upper portion 121-2 includes a dielectric material, such as silicon oxide or other suitable dielectric materials. The lower portion 121-1 includes a semiconductor material, such as polysilicon. The liner 125 wraps around the sidewalls and the bottom surface of the core portion 121. The material of the liner 125 is, for example, silicon oxide, silicon nitride, silicon oxynitride or a combination thereof. The peripheral portion 127 surrounds a part of the liner 125 and a part of the upper portion 121-2 of the core portion 121. For example, the peripheral portion 127 surrounds the parts of the liner 125 and the upper portion 121-2 of the core portion 121 those are near the top surface of the second epitaxial layer 105. The material of the peripheral portion 127 is, for example, silicon oxide. The bottom surface of the peripheral portion 127 may be slightly higher than the bottom surface of the upper portion 121-2 of the core portion 121. In some embodiments, the top surface of the peripheral portion 127 and the top surface of the upper portion 121-2 of the core portion 121 may be on the same plane, and the same plane may be slightly higher than the top surface of the second epitaxial layer 105. In some embodiments, the depth H of the deep trench isolation structure 120 is 1.5 times to 2.5 times the total thickness T of the first epitaxial layer 103 and the second epitaxial layer 105. The total thickness T of the first epitaxial layer 103 and the second epitaxial layer 105 may be greater than or equal to about 10 micrometers ($\mu m$), but not limited thereto. According to the embodiments of the present disclosure, the deep trench isolation structure 120 provides a good electrical isolation effect for the semiconductor device 100 to reduce substrate leakage current.

Still referring to FIG. 1, the semiconductor device 100 further includes a fourth well region 117 having a second conductivity type, such as a high-voltage p-well (HVPW). The fourth well region 117 is disposed in the second epitaxial layer 105 of the substrate 10. Moreover, the fourth well region 117 includes two portions adjacent to two opposite outer sides of the deep trench isolation structure 120, respectively. In some embodiments, the doping concentration of the fourth well region 117 may be the same as the doping concentration of the second well region 113. The bottom surface of the fourth well region 117 and the bottom surface of the second well region 113 may be on the same plane. In another embodiment, the doping concentration of the fourth well region 117 may be different from that of the second well region 113. The bottom surface of the fourth well region 117 may be slightly higher or lower than the bottom surface of the second well region 113. In addition, the semiconductor device 100 includes a source region 145, a drain region 143 and a gate electrode 141. The source region 145 is disposed in the right portion of the second well region 113. The drain region 143 is disposed in the first well region 111. The gate electrode 141 is disposed on the first well region 111 and the second well region 113, and located directly above the interface of the first well region 111 and the second well region 113. The source region 145 and the drain region 143 are located on two sides of the gate electrode 141, respectively. In some embodiments, both the drain region 143 and the source region 145 are heavily doped regions with the first conductivity type, such as n-type heavily doped regions. Moreover, a heavily doped contact region 151 having the second conductivity type, such as a p-type heavily doped contact region (P+ contact region) is also disposed in the right portion of the second well region 113. The heavily doped contact region 151 is adjacent to the source region 145. In addition, a body region 114 having the second conductivity type, such as a p-body region, is also disposed in the right portion of the second well region 113. The body region 114 is located directly under the source region 145 and the heavily doped contact region 151.

In addition, the semiconductor device 100 includes a plurality of isolation regions which may be respectively disposed at the interface of the well regions having different conductivity types, but the positions of the isolation regions of the semiconductor devices of the present disclosure are not limited thereto. In one embodiment, an isolation region is disposed in the second well region 113 where the source region 145 is located therein. The isolation region is also disposed in the first well region 111 where the drain region 143 is located therein. Another isolation region is disposed outside the fourth well region 117. As shown in FIG. 1, a first isolation region 131 is disposed in the right portion of the second well region 113 and also at the interface between the first well region 111 and the left portion of the second well region 113. A second isolation region 132 is disposed at the interface between the second well region 113 and the third well region 115. A third isolation region 133 is disposed outside the fourth well region 117. A fourth isolation region 134 is disposed in the first well region 111 and located between the drain region 143 and the gate electrode 141. Moreover, a portion of the fourth isolation region 134 is located directly under the gate electrode 141. In some embodiments, the first isolation region 131, the second isolation region 132 and the third isolation region 133 may be shallow trench isolation (STI) regions or field oxide layers, and the fourth isolation region 134 is a STI region.

In addition, the semiconductor device 100 includes a plurality of heavily doped contact regions disposed in each of the well regions. As shown in FIG. 1, heavily doped contact regions 153 and 155 having the second conductivity type, such as p-type heavily doped contact regions (P$^+$ contact regions) are disposed in the second well region 113, where the heavily doped contact region 153 is disposed in the right portion of the second well region 113, and the heavily doped contact region 155 is disposed in the left portion of the second well region 113. Both the heavily doped contact regions 153 and 155 are located between the first isolation region 131 and the second isolation region 132. A heavily doped contact region 157 having the first conductivity type, such as an n-type heavily doped contact region (N$^+$ contact region), is disposed in the third well region 115 and located between the second isolation region 132 and the deep trench isolation structure 120. A heavily doped contact region 159 having the second conductivity type, such as a p-type heavily doped contact region (P$^+$ contact region), is disposed in the fourth well region 117 and located between the deep trench isolation structure 120 and the third isolation region 133. In some embodiments, the heavily doped contact region 151 is electrically connected to both the source region 145 and the heavily doped contact region 153 and is further electrically coupled to a source/base voltage (Vs/B). The heavily doped contact region 157 is electrically coupled to an isolation voltage (Viso). The heavily doped contact region 159 is electrically coupled to a substrate voltage (Vsub). The first buried layer 107, the second buried layer 109 and the third well region 115 are electrically coupled to the isolation voltage (Viso) through the heavily doped contact region 157 to avoid unnecessary substrate leakage current during the operation of the semiconductor device 100.

In addition, as shown in FIG. 1, in some embodiments, a doped region 112 having the first conductivity type, such as an n-type field effect deposition region (NFD), is further disposed in the first well region 111, and the drain region 143 is located in the doped region 112. Moreover, the semiconductor device 100 may further include an insulating layer 147 and a metal layer 149 stacked upward in sequence and disposed between the drain region 143 and the gate electrode 141, where a portion of the insulating layer 147 and a portion of the metal layer 149 are extended laterally onto the gate electrode 141. While the gate electrode 141 is formed of polysilicon, the portion of the insulating layer 147 and the portion of the metal layer 149 combined with a portion of the gate electrode 141 to construct a metal-insulator-polysilicon capacitor structure. The stacked insulating layer 147 and the metal layer 149 may be used as a field plate to regulate the electric field distribution in the first well region 111.

Figure 2:
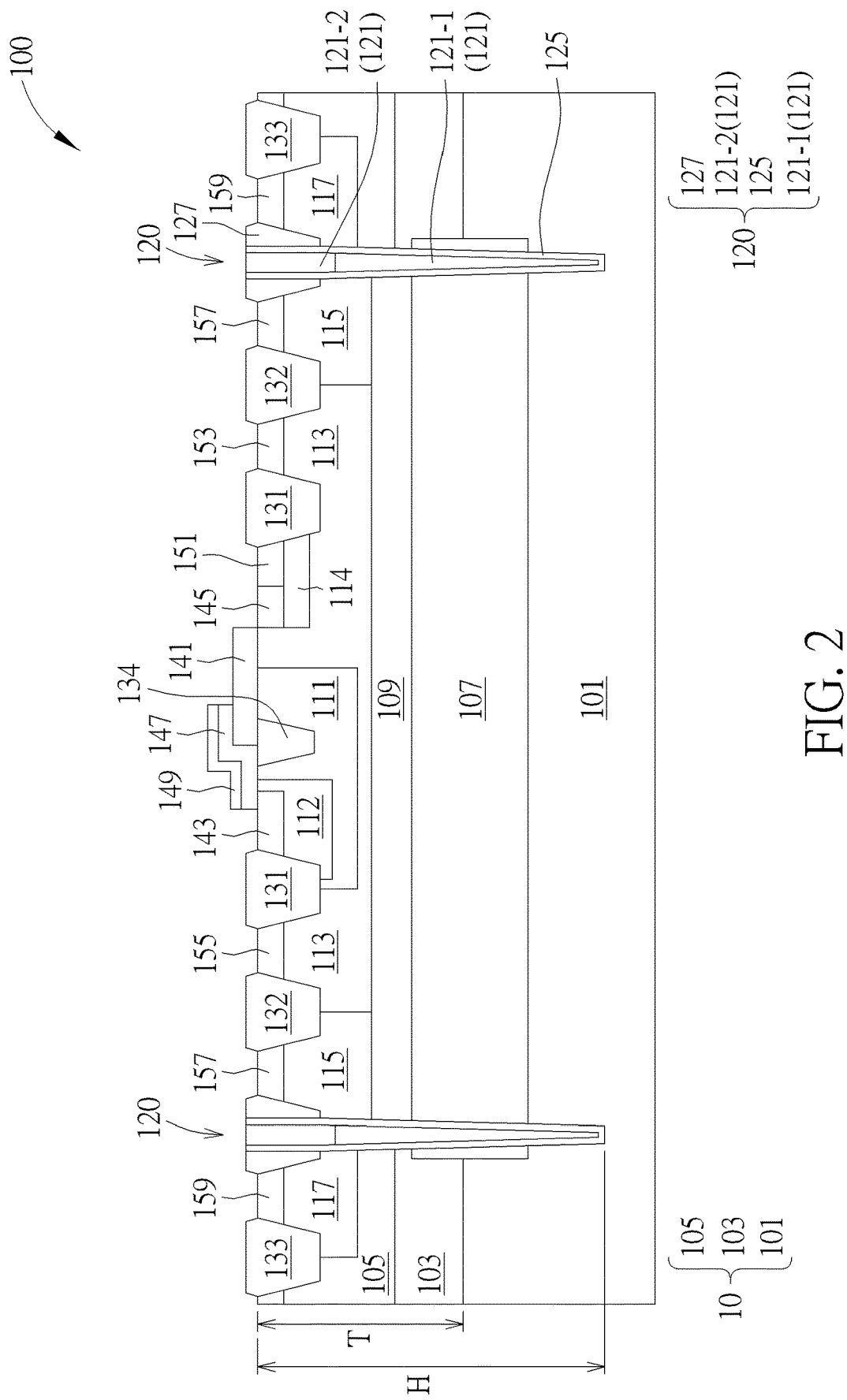
FIG. 2 is a schematic cross-sectional view of a semiconductor device according to another embodiment of the present disclosure.

FIG. 2 is a schematic cross-sectional view of a semiconductor device according to another embodiment of the present disclosure. The difference between the semiconductor device 100 of FIG. 2 and the semiconductor device 100 of FIG. 1 is that the bottom surface of the second well region 113 of the semiconductor device 100 of FIG. 2 is lower than the bottom surface of the first well region 111, and the bottom surface of the second well region 113 as shown in FIG. 2 is in contact with the top surface of the second buried layer 109. Moreover, as shown in FIG. 2, a portion of the second well region 113 is disposed between the first well region 111 and the second buried layer 109. The second well region 113 and the second buried layer 109 are not separated by the second epitaxial layer 105. In this embodiment, each of the first epitaxial layer 103 and the second epitaxial layer 105 is a semiconductor epitaxial layer having a first or a second conductivity type, such as an n-type silicon epitaxial layer (N-epi layer) or a p-type silicon epitaxial layer (P-epi layer). For example, while the first epitaxial layer 103 is a semiconductor epitaxial layer having the first conductivity type (n-type silicon epitaxial layer), the second epitaxial layer 105 is a semiconductor epitaxial layer having the second conductivity type (p-type silicon epitaxial layer). While the first epitaxial layer 103 is a semiconductor epitaxial layer having the second conductivity type (p-type silicon epitaxial layer), the second epitaxial layer 105 is a semiconductor epitaxial layer having the second conductivity type (p-type silicon epitaxial layer) or a semiconductor epitaxial layer having the first conductivity type (n-type silicon epitaxial layer). The details of other features of the semiconductor device 100 of FIG. 2 may refer to the aforementioned descriptions of the semiconductor device 100 of FIG. 1, which will not be repeated here.

Figure 3:
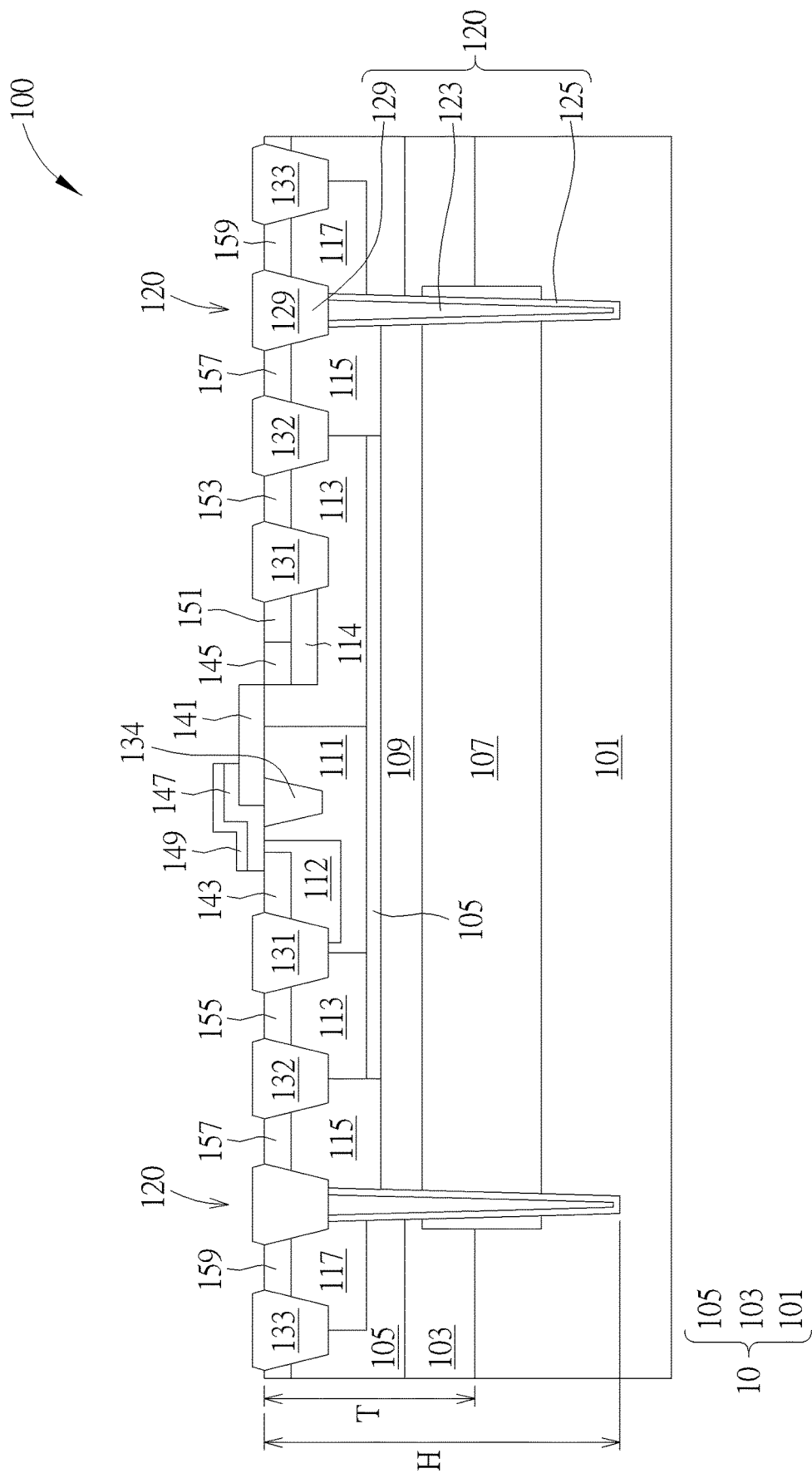
FIG. 3 is a schematic cross-sectional view of a semiconductor device according to further another embodiment of the present disclosure.

FIG. 3 is a schematic cross-sectional view of a semiconductor device according to further another embodiment of the present disclosure. The difference between the semiconductor device 100 of FIG. 3 and the semiconductor device 100 of FIG. 1 is that the deep trench isolation structure 120 of the semiconductor device 100 of FIG. 3 includes a trench isolation portion 123, a liner 125 and a dielectric isolation portion 129. The liner 125 wraps around the sidewalls and bottom surface of the trench isolation portion 123. The dielectric isolation portion 129 is disposed directly above the trench isolation portion 123 and the liner 125. The bottom surface of the dielectric isolation portion 129 is in contact with the top surface of the trench isolation portion 123 and the top surface of the liner 125. The material of the trench isolation portion 123 includes a semiconductor material, such as polysilicon. The material of the liner 125 is, for example, silicon oxide, silicon nitride, silicon oxynitride or a combination thereof. The material of the dielectric isolation portion 129 includes a dielectric material such as silicon oxide or other suitable dielectric materials. The dielectric isolation portion 129 may be a STI region or a field oxide layer. The dielectric isolation portion 129 may be formed by the process of forming other isolation regions such as the first isolation region 131, the second isolation region 132 and the third isolation region 133. As shown in FIG. 3, in one embodiment, the dielectric isolation portion 129 is extended downward from the top surface of the second epitaxial layer 105 until a position in depth of the second epitaxial layer 105. The trench isolation portion 123 is extended downward from the position in depth of the second epitaxial layer 105, passing through the first epitaxial layer 103, the second buried layer 109 and the first buried layer 107 until a position in depth of the semiconductor substrate 101. In some embodiments, the depth H of the deep trench isolation structure 120 is 1.5 times to 2.5 times the total thickness T of the first epitaxial layer 103 and the second epitaxial layer 105. The total thickness T may be greater than or equal to 10 μm, but not limited thereto. According to the embodiments of the present disclosure, the deep trench isolation structure 120 provides a good isolation effect for the semiconductor device 100 to reduce substrate leakage current. The details of other features of the semiconductor device 100 of FIG. 3 may refer to the aforementioned descriptions of the semiconductor device 100 of FIG. 1, which will not be repeated here.

Figure 4:
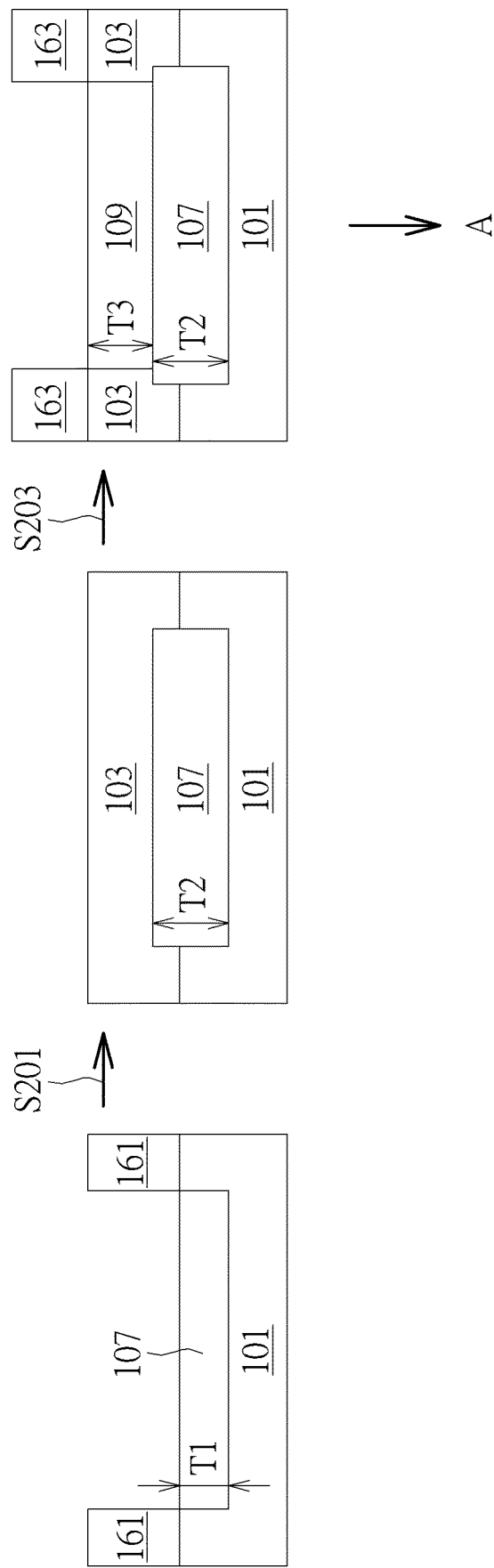
FIG. 4, FIG. 5, FIG. 6, FIG. 7, FIG. 8 and FIG. 9 are schematic cross-sectional views of intermediate stages of a method of fabricating a semiconductor device according to an embodiment of the present disclosure.

FIG. 4, FIG. 5, FIG. 6, FIG. 7, FIG. 8 and FIG. 9 are schematic cross-sectional views of intermediate stages of a method of fabricating a semiconductor device according to an embodiment of the present disclosure. Referring to FIG. 4, firstly, a semiconductor substrate 101 is provided and a patterned photoresist layer 161 is formed on the semiconductor substrate 101. An ion implantation process is performed on the semiconductor substrate 101 through the opening of the patterned photoresist layer 161 to implant ions of the first conductivity type (n-type ions), such as phosphorus (P), arsenic (As) or antimony (Sb) into the semiconductor substrate 101 to form a first buried layer 107 having the first conductivity type in the semiconductor substrate 101. In some embodiments, the doping concentration of the first buried layer 107 is about 1E13 to 1E15 ions/cm$^3$, or about 5E13 to 5E14 ions/cm$^3$. In this process stage, the first buried layer 107 has a first thickness T1. Next, step S201 is performed to remove the patterned photoresist layer 161, and then a first epitaxial layer 103 is formed on the semiconductor substrate 101 and the first buried layer 107 by an epitaxial growth process. During the epitaxial growth process, the first epitaxial layer 103 is doped with ions of the first or second conductivity type, so that the first epitaxial layer 103 has the first or second conductivity type. The ions of the second conductivity type (p-type ions) are, for example, boron (B). In some embodiments, the thickness of the first epitaxial layer 103 may be equal to or greater than about 4.5 μm, but not limited thereto. Meanwhile, due to the temperature of this epitaxial growth process, the ions in the first buried layer 107 are thermally diffused into the first epitaxial layer 103, so that the first buried layer 107 is formed in both the semiconductor substrate 101 and the first epitaxial layer 103. After the step S201, the first buried layer 107 has a second thickness T2 that is greater than the first thickness T1.

Still refer to FIG. 4, then, step S203 is performed to form a patterned photoresist layer 163 on the first epitaxial layer 103. An ion implantation process is performed on the first epitaxial layer 103 through the opening of the patterned photoresist layer 163 to implant ions of the first conductivity type (n-type ions), such as phosphorus (P), arsenic (As), or antimony (Sb) into the first epitaxial layer 103 to form a second buried layer 109 having the first conductivity type in the first epitaxial layer 103. In some embodiments, the doping concentration of the second buried layer 109 is about 1E11 to 1E13 ions/cm$^3$, or about 5E11 to 5E12 ions/cm$^3$, so that the doping concentration of the second buried layer 109 is lower than that of the first buried layer 107. In other embodiments, both the doping concentrations of the first buried layer 107 and the second buried layer 109 may be about 1E13 ions/cm$^3$, so that the doping concentration of the second buried layer 109 is equal to that of the first buried layer 107. After the step S203, the second buried layer 109 has a third thickness T3.

Figure 5:
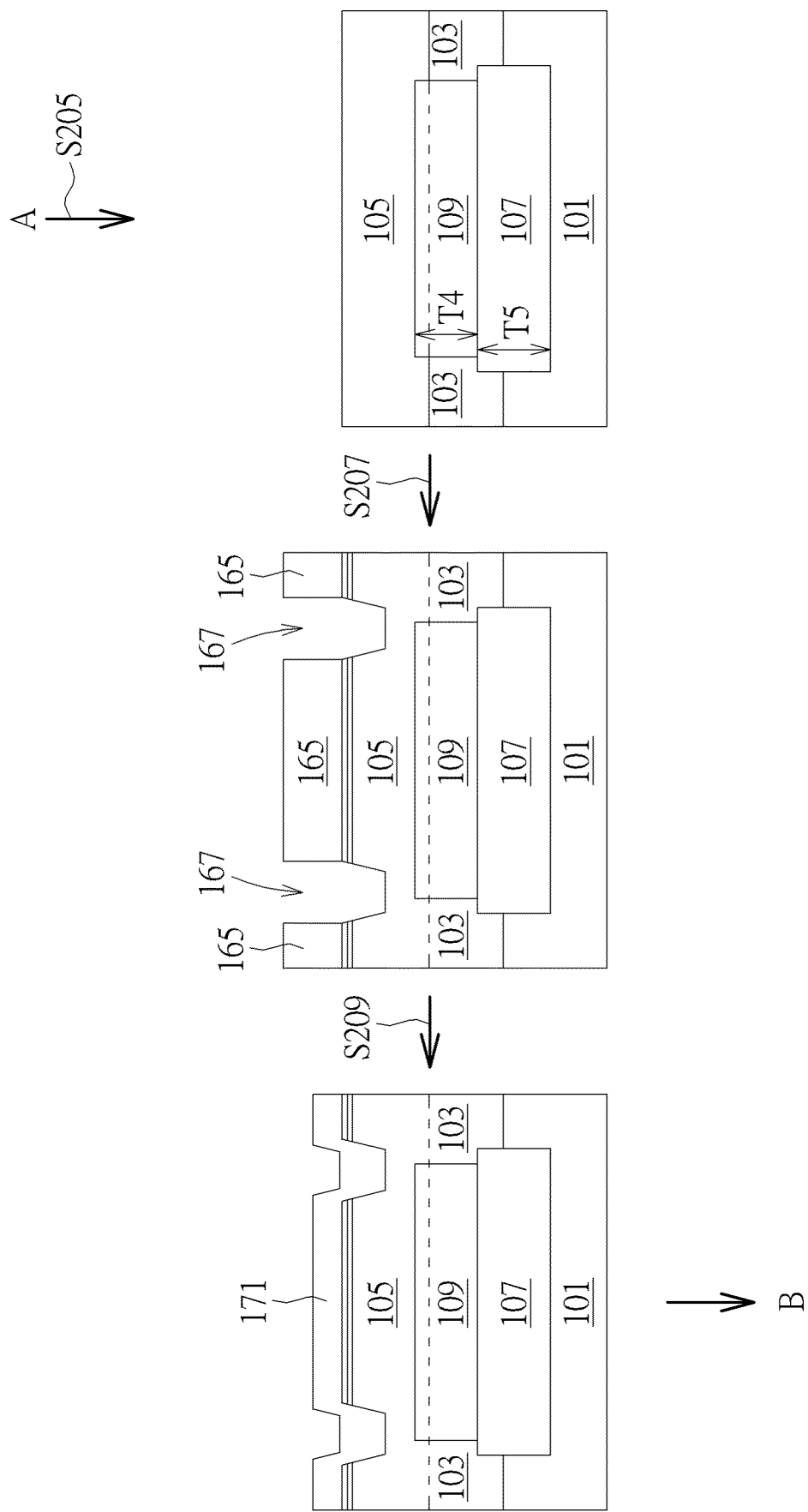

Next, referring to FIG. 5, step S205 is performed to form a second epitaxial layer 105 on the first epitaxial layer 103 and the second buried layer 109 by using an epitaxial growth process. During the epitaxial growth process, the second epitaxial layer 105 is doped with ions of the second conductivity type, so that the second epitaxial layer 105 has the second conductivity type. The ions of the second conductivity type (p-type ions) are, for example, boron (B). In other embodiments, the second epitaxial layer 105 is doped with ions of the first conductivity type (n-type ions), so that the second epitaxial layer 105 has the first conductivity type. In some embodiments, the thickness of the second epitaxial layer 105 may be equal to or greater than about 4.5 μm, but not limited thereto. Meanwhile, due to the temperature of this epitaxial growth process, the ions in the second buried layer 109 are thermally diffused into the second epitaxial layer 105, so that the second buried layer 109 is formed in both the first epitaxial layer 103 and the second epitaxial layer 105. Meanwhile, the ions in the first buried layer 107 are also thermally diffused upward and downward into the first epitaxial layer 103 and the semiconductor substrate 101. After the step S205, the second buried layer 109 has a fourth thickness T4, and the first buried layer 107 has a fifth thickness T5, where the fourth thickness T4 is greater than the third thickness T3, and the fifth thickness T5 is greater than the second thickness T2. In some embodiments, the fifth thickness T5 of the first buried layer 107 is about 6 μm, and the fourth thickness T4 of the second buried layer 109 is about 4 μm, but not limited thereto. The fifth thickness T5 of the first buried layer 107 is greater than the fourth thickness T4 of the second buried layer 109. In some embodiments, the total thickness of the fifth thickness T5 of the first buried layer 107 and the fourth thickness T4 of the second buried layer 109 is about to 30 μm, but not limited thereto.

Still refer to FIG. 5, step S207 is performed to form a patterned photoresist layer 165 on the second epitaxial layer 105. Then, an etching process is performed on the second epitaxial layer 105 through the opening of the patterned photoresist layer 165 to form a shallow trench 167 in the second epitaxial layer 105, where the bottom surface of the shallow trench 167 is higher than the top surface of the second buried layer 109. Next, at step S209, after the patterned photoresist layer 165 is removed, a first dielectric material layer 171 is deposited on the second epitaxial layer 105 and to fill up the shallow trench 167 by a deposition process. The first dielectric material layer 171 is, for example, a silicon oxide layer. In some embodiments, the deposition process may be a high-density plasma (HDP) chemical vapor deposition (CVD) process, which has good gap filling capability to fill up the shallow trench 167.

Figure 6:
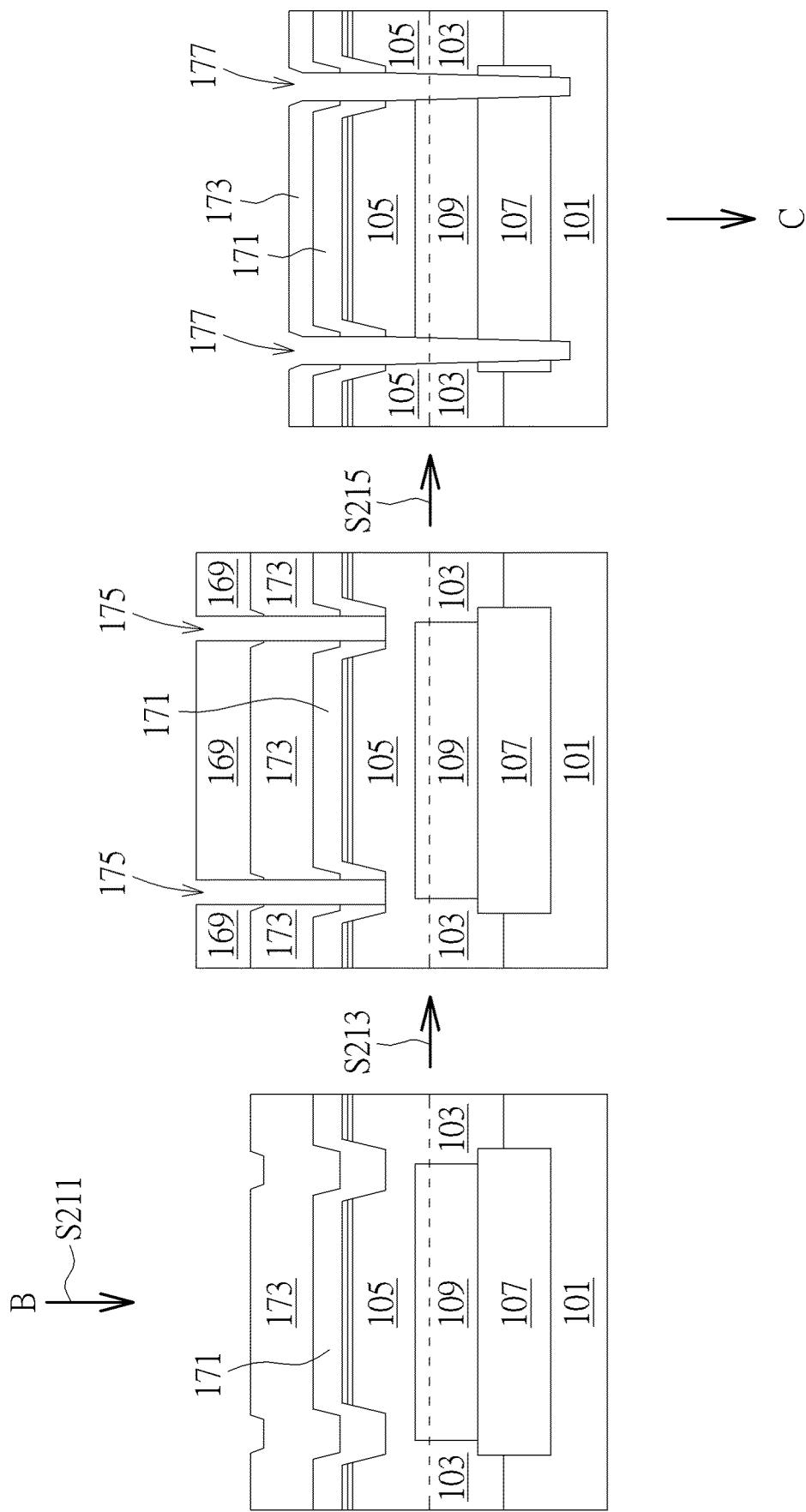

Thereafter, referring to FIG. 6, step S211 is performed to form a hard mask layer 173 on the first dielectric material layer 171 by a deposition process. In some embodiments, the deposition process is a low pressure chemical vapor deposition (LPCVD) process using tetra-ethoxysilane (TEOS), and the hard mask layer 173 is, for example, a silicon oxide layer. Next, at step S213, a patterned photoresist layer 169 is formed on the hard mask layer 173, and an etching process is performed on the hard mask layer 173 and the first dielectric material layer 171 through the opening of the patterned photoresist layer 169 to form an initial trench 175 of a deep trench in the hard mask layer 173 and the first dielectric material layer 171. The position of the initial trench 175 corresponds to the shallow trench 167, and the bottom surface of the initial trench 175 and the bottom surface of the shallow trench 167 may be on the same plane. The width of the initial trench 175 is smaller than the width of the shallow trench 167, so that the initial trench 175 is surrounded by the remaining first dielectric material layer 171 in the shallow trench 167. Next, at step S215, an etching process is performed on the second epitaxial layer 105, the second buried layer 109, the first buried layer 107 and the semiconductor substrate 101 through the initial trench 175 to form a deep trench 177 that passes through the hard mask layer 173, the first dielectric material layer 171 in the shallow trench 167, the second epitaxial layer 105, the second buried layer 109 and the first buried layer 107 until a position in depth of the semiconductor substrate 101, so that the bottom surface of the deep trench 177 is lower than the bottom surface of the first buried layer 107. Afterwards, the patterned photoresist layer 169 is removed to expose the hard mask layer 173.

Figure 7:
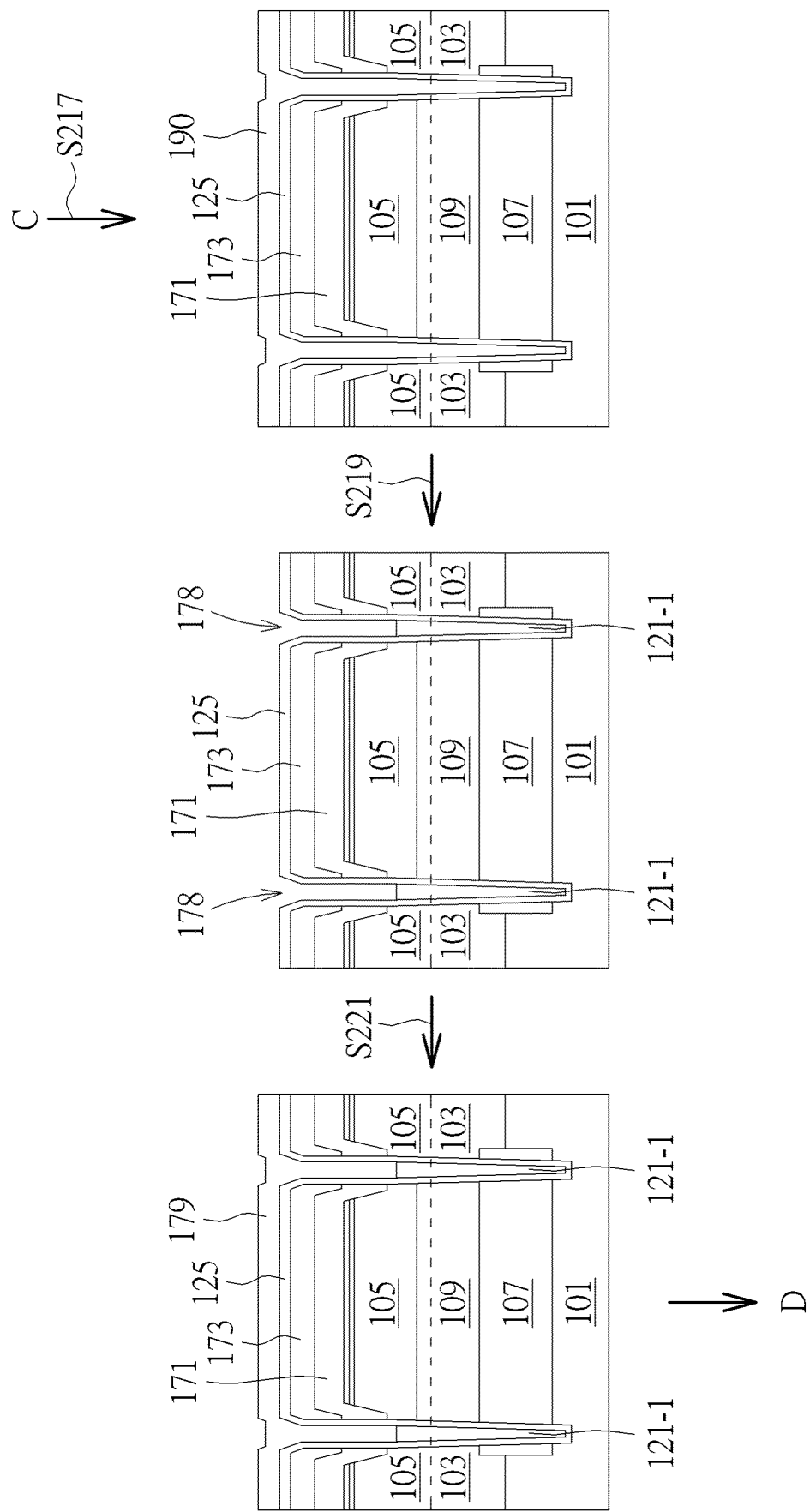

Next, referring to FIG. 7, at step S217, a liner 125 is conformally deposited on the top surface of the hard mask layer 173 and the inner sidewalls and the bottom surface of the deep trench 177. In some embodiments, this deposition process may be a LPCVD process using TEOS, and the liner 125 is, for example, a silicon oxide layer. Then, a filling material layer 190 is deposited on the liner 125 to fill up the deep trenches 177. In some embodiments, the filling material layer 190 is a polysilicon layer, and the filling material layer 190 may be deposited by a LPCVD process. Next, at step S219, a chemical mechanical planarization (CMP) process is performed on the filling material layer 190 above the hard mask layer 173 to expose the liner 125. Thereafter, the filling material layer 190 in the deep trench 177 is etched back to form a lower portion 121-1 of the core portion 121 of the deep trench isolation structure 120, and to form a trench 178 on the lower portion 121-1. The trench 178 is the remaining portion of the deep trench 177. In some embodiments, the top surface of the lower portion 121-1 is higher than the top surface of the second buried layer 109 and lower than the bottom surface of the shallow trench 167. Afterwards, at step S221, a second dielectric material layer 179 is deposited on the liner 125 and to fill up the trench 178, i.e., the remaining portion of the deep trench 177 is filled up with the second dielectric material layer 179. The second dielectric material layer 179 is, for example, a silicon oxide layer. In some embodiments, the deposition process for depositing the second dielectric material layer 179 may be a high density plasma (HDP) CVD process, which has good gap filling capability to fill up the trench 178.

Figure 8:
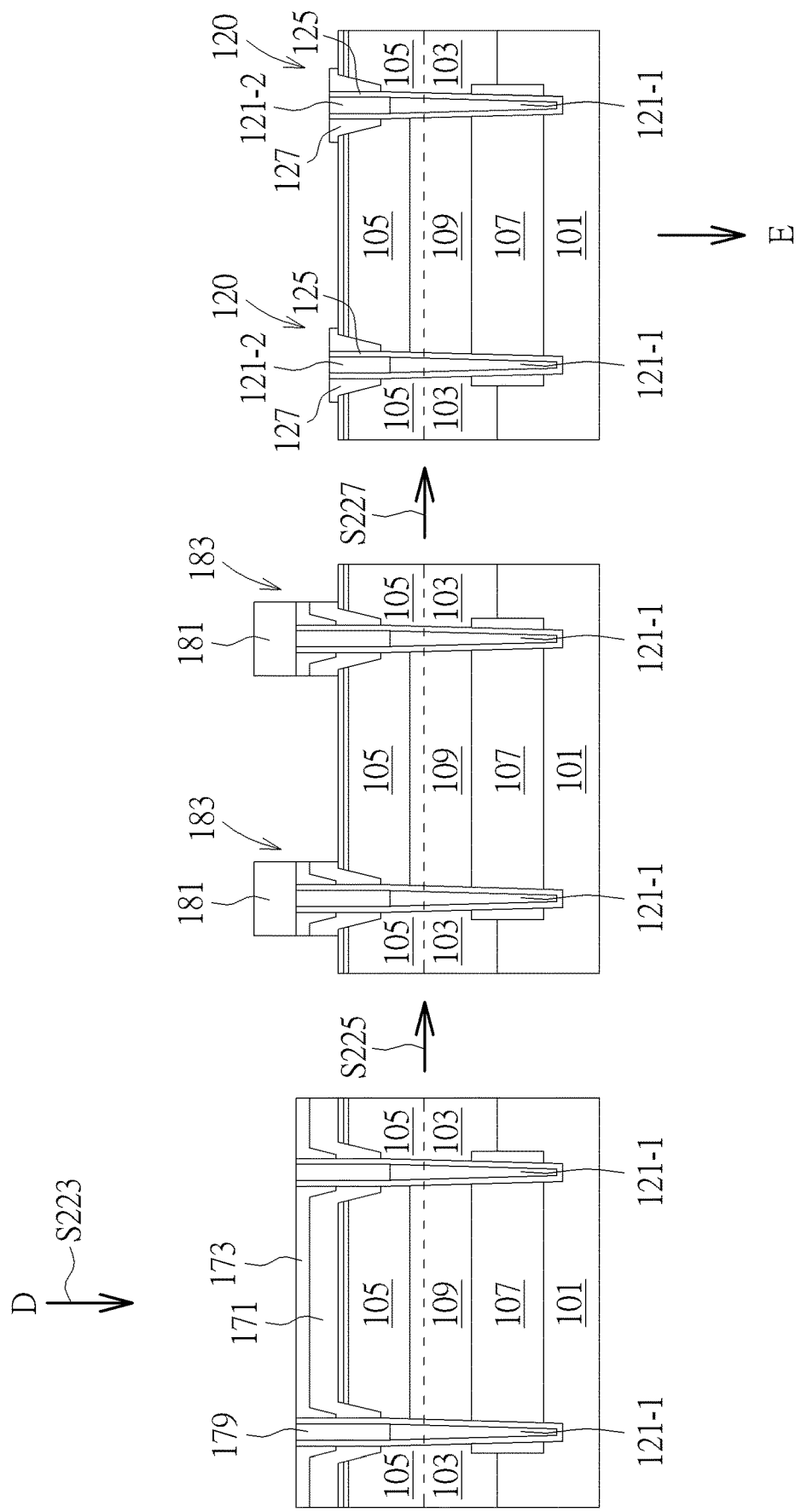

Then, referring to FIG. 8, at step S223, a CMP process is performed to remove the second dielectric material layer 179 and the liner 125 above the hard mask layer 173 to expose the hard mask layer 173, so that the top surface of the second dielectric material layer 179 in the trench 178 and the top surface of the hard mask layer 173 are on the same plane. Thereafter, at step S225, a patterned photoresist layer 181 is formed on the hard mask layer 173. The patterned photoresist layer 181 is used as an etching mask, and an etching process is performed to pattern the hard mask layer 173 and the first dielectric material layer 171 to form a protruding portion 183 located directly above a subsequently formed deep trench isolation structure. Next, at step S227, after the patterned photoresist layer 181 is removed, a CMP process is performed to remove the protruding portion 183 to form a deep trench isolation structure 120. In this embodiment, the deep trench isolation structure 120 includes the lower portion 121-1 and an upper portion 121-2 of the core portion 121, the liner 125 and a peripheral portion 127. The lower portion 121-1 of the core portion 121 is formed by the step S217 and the step S219 of FIG. 7 and formed from a portion of the filling material layer 190 that fills up the deep trench 177. The upper portion 121-2 of the core portion 121 is formed by the step S221 of FIG. 7 and formed from the second dielectric material layer 179 that fills up the trench 178 (the remaining portion of the deep trench). The liner 125 is formed by the step S217 of FIG. 7 and formed from the liner 125 deposited in the deep trench 177. The liner 125 warps around the sidewalls and the bottom surface of the core portion 121. The peripheral portion 127 is formed by the step S211 and the step S213 of FIG. 6 and formed from the remaining first dielectric material layer 171 that fills up the shallow trench 167. The peripheral portion 127 surrounds the liner 125 and the upper portion 121-2 of the core portion 121.

Figure 9:
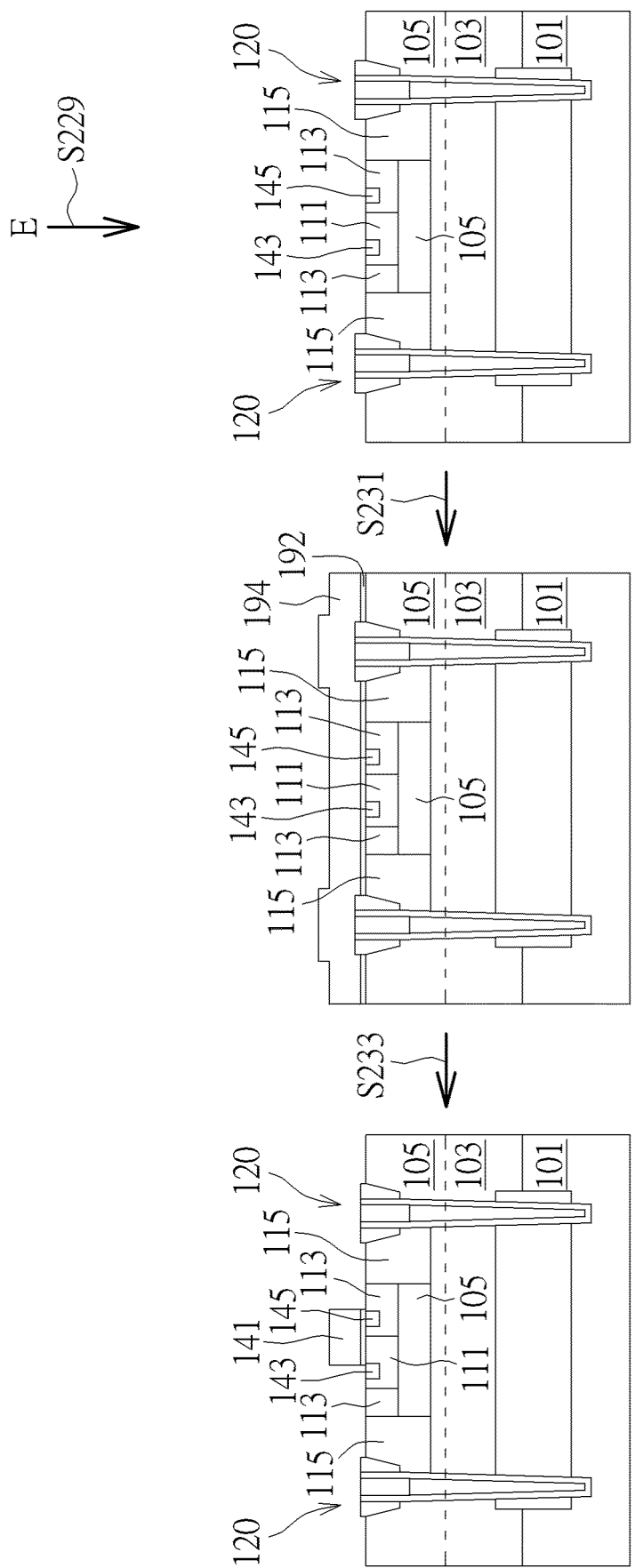

Next, referring to FIG. 9, at step S229, well regions, doped regions, heavily doped contact regions and isolation regions of the semiconductor device 100 are formed in the second epitaxial layer 105. For example, a first well region 111, a second well region 113, a third well region 115, a fourth well region 117, a source region 145, a drain region 143, a doped region 112, heavily doped contact regions 151, 153, 155, 157 and 159, a body region 114, a first isolation region 131, a second isolation region 132, a third isolation region 133 and a fourth isolation region 134 as shown in FIG. 1 are formed in the second epitaxial layer 105. For the sake of clarity and brevity in figure, not all of the aforementioned regions are depicted in FIG. 9, and the details of the aforementioned regions may refer to the descriptions of FIG. 1. In some embodiments, the well regions, the doped regions or the heavily doped contact regions having the same conductivity type and the same depth may be formed at the same ion implantation process step, and the isolation regions may be formed at the same etching, deposition and CMP process steps, or at the same oxidation process step. Thereafter, at step S231, a gate dielectric layer 192 and a gate electrode material layer 194 are sequentially and completely deposited over the second epitaxial layer 105, the deep trench isolation structure 120, the well regions, the doped regions, the heavily doped contact regions and the isolation regions. The gate dielectric layer 192 is, for example, a silicon oxide layer. The gate electrode material layer 194 is, for example, a polysilicon layer. Next, at step S233, the gate electrode material layer 194 is patterned by photolithography and etching processes to form a gate electrode 141 on the gate dielectric layer 192. Thereafter, an insulating layer 147 and a metal layer 149 as shown in FIG. 1 may be sequentially formed on the first well region 111 and the gate electrode 141 to complete the semiconductor device 100.

Figure 10:
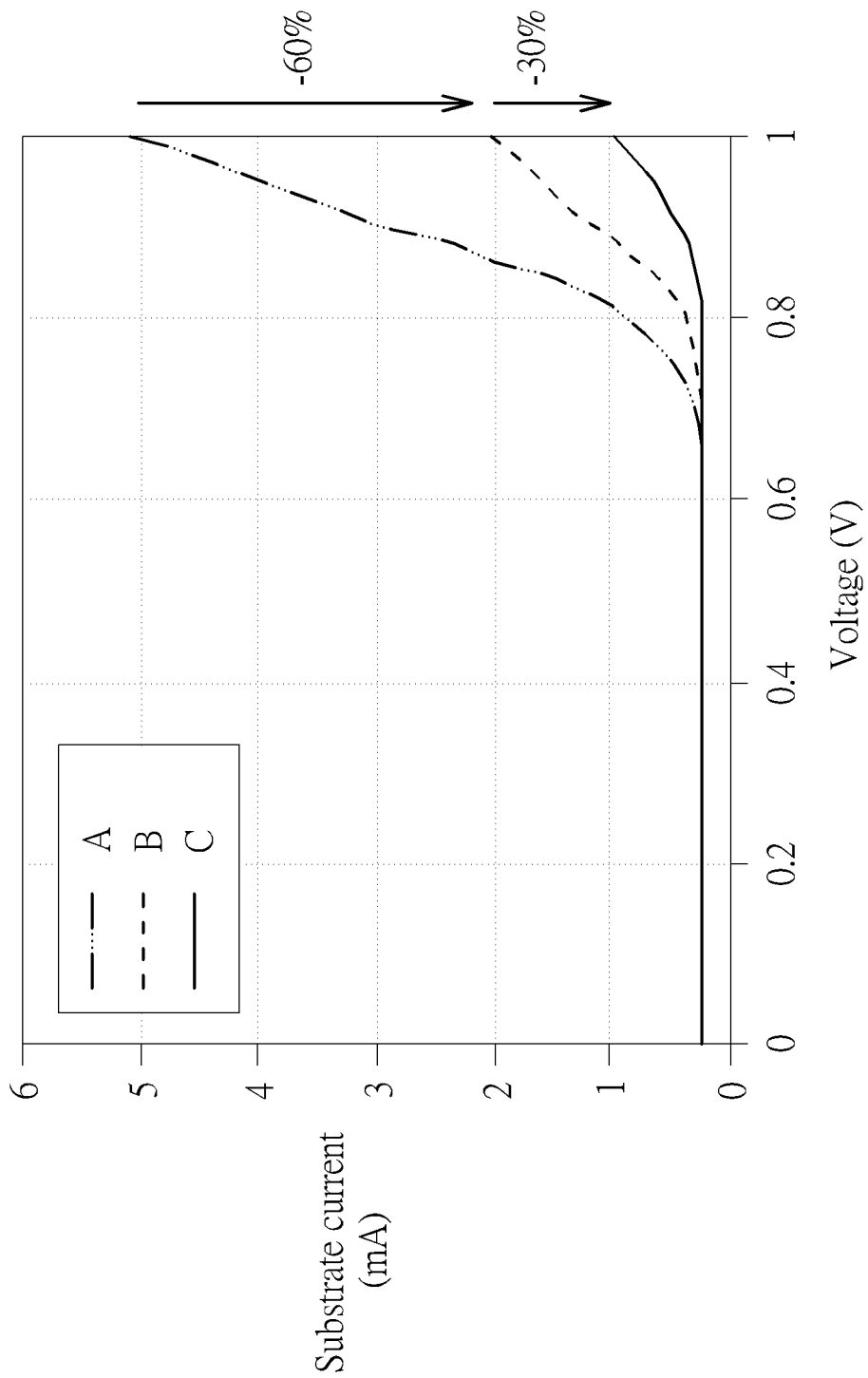
FIG. 10 is a graph of substrate current versus source voltage of several semiconductor devices according to some embodiments of the present disclosure.

FIG. 10 is a graph of substrate current versus source voltage of several semiconductor devices according to some embodiments of the present disclosure, where the vertical axis represents the substrate current (Isub) with the unit of milliampere (mA), and the horizontal axis represents the source voltage (Vs) with the unit of volts (V). The profile A in FIG. 10 represents the substrate current (or referred to as the substrate leakage current) corresponding to the source voltage of a semiconductor device without the deep trench isolation structure 120 and the first buried layer 107 of the semiconductor device 100 of FIG. 1. The profile B in FIG. 10 represents the substrate current corresponding to the source voltage of a semiconductor device without the first buried layer 107 of the semiconductor device 100 of FIG. 1. The profile C represents the substrate current corresponding to the source voltage of the semiconductor device 100 of FIG. 1. Through comparing the profile A, the profile B and the profile C of FIG. 10, it should be known that the substrate current of the profile B where the semiconductor device includes the second buried layer 109 and the deep trench isolation structure 120 is reduced by about 60% at the source voltage of 1V while compared with the substrate current of the profile A where the semiconductor device includes only the second buried layer 109. In addition, the substrate current of the profile C where the semiconductor device 100 includes all of the first buried layer 107, the second buried layer 109 and the deep trench isolation structure 120 is reduced by about 30% at the source voltage of 1V while compared with the substrate current of curve B where the semiconductor device includes the second buried layer 109 and the deep trench isolation structure 120. Moreover, the substrate current of the profile C is reduced by about 90% at the source voltage of 1V while compared with the substrate current of the profile A where the semiconductor device includes only the second buried layer 109. In addition, when the source voltage is greater than 0.75V, the substrate current of the profile C is lower than the substrate currents of the profile A and the profile B.

Accordingly, the semiconductor devices 100 of the embodiments of the present disclosure reduce the characteristics of parasitic bipolar transistor in the semiconductor device through providing the first buried layer 107, the second buried layer 109 and the deep trench isolation structure 120, thereby reducing the substrate leakage current and avoiding the latch-up effect to achieve an isolation effect similar to an isolation effect achieved by a semiconductor device using a SOI substrate. Therefore, the cost of fabricating the semiconductor devices of the present disclosure is reduced, and the poor thermal conductivity caused by the use of the SOI substrate is also avoided. In addition, when the semiconductor devices of the present disclosure are applied with a high operating voltage, the substrate leakage current is effectively reduced without increasing the size of the semiconductor devices, thereby enhancing the breakdown voltage and improving the reliability of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a semiconductor substrate;
a first epitaxial layer disposed on the semiconductor substrate;
a second epitaxial layer disposed on the first epitaxial layer;
a first buried layer, having a first conductivity type and disposed in the semiconductor substrate and the first epitaxial layer;
a second buried layer, having the first conductivity type, disposed on the first buried layer, and embedded in the first epitaxial layer and the second epitaxial layer;
a first well region, having the first conductivity type and disposed above the second buried layer;
a second well region, having a second conductivity type opposite to the first conductivity type and abutting the first well region, wherein both a bottom surface of the second well region and a bottom surface of the first well region are vertically separated from the second buried layer by a distance through the second epitaxial layer;
a deep trench isolation structure, disposed in the substrate and surrounding the first well region and the second well region, wherein a bottom surface of the deep trench isolation structure is lower than a bottom surface of the first buried layer;
a third well region having the first conductivity type, surrounding the first well region and the second well region, and located between the first well region and the deep trench isolation structure, and between the second well region and the deep trench isolation structure, wherein a bottom surface of the third well region is in contact with a top surface of the second buried layer, and the bottom surface of the third well region is lower than the bottom surface of the first well region;
a source region, disposed in the second well region;
a drain region, disposed in the first well region; and
a gate electrode, disposed on the first well region and the second well region.

2. The semiconductor device of claim 1, wherein a doping concentration of the second buried layer is equal to or lower than a doping concentration of the first buried layer.

3. The semiconductor device of claim 1, wherein a thickness of the first buried layer is greater than a thickness of the second buried layer.

4. The semiconductor device of claim 1, wherein the deep trench isolation structure passes through the second buried layer and the first buried layer.

5. The semiconductor device of claim 1, wherein the second well region comprises two portions adjacent to two sides of the first well region, respectively, and the bottom surface of the second well region is on the same level with the bottom surface of the first well region.

6. The semiconductor device of claim 1, wherein both the second epitaxial layer and the first epitaxial layer have the second conductivity type, or the second epitaxial layer has the second conductivity type and the first epitaxial layer has the first conductivity type, or the second epitaxial layer has the first conductivity type and the first epitaxial layer has the second conductivity type.

7. The semiconductor device of claim 1, wherein a depth of the deep trench isolation structure is 1.5 times to 2.5 times a total thickness of the second epitaxial layer and the first epitaxial layer.

8. The semiconductor device of claim 1, wherein the deep trench isolation structure comprises:
a core portion comprising an upper portion and a lower portion, wherein the upper portion includes a dielectric material, and the lower portion includes polysilicon;
a liner wrapping around the core portion; and
a peripheral portion surrounding the liner and the upper portion.

9. The semiconductor device of claim 1, wherein the deep trench isolation structure comprises:
a trench isolation portion;
a liner wrapping around the trench isolation portion; and
a dielectric isolation portion disposed directly above the trench isolation portion,
wherein a bottom surface of the dielectric isolation portion is in contact with a top surface of the trench isolation portion, and the trench isolation portion includes polysilicon.

10. The semiconductor device of claim 1, wherein the first buried layer has a pattern embedded in the semiconductor substrate and the first epitaxial layer, and the second buried layer has another pattern embedded in the first epitaxial layer and the second epitaxial layer.

11. A method of fabricating a semiconductor device, comprising:
providing a semiconductor substrate;

growing a first epitaxial layer on the semiconductor substrate;

forming a first buried layer in the semiconductor substrate and the first epitaxial layer, wherein the first buried layer has a first conductivity type;

growing a second epitaxial layer on the first epitaxial layer;

forming a second buried layer on the first buried layer and embedded in the first epitaxial layer and the second epitaxial layer, wherein the second buried layer has the first conductivity type;

forming a first well region above the second buried layer, wherein the first well region has the first conductivity type;

forming a second well region abutting the first well region, wherein the second well region has a second conductivity type opposite to the first conductivity type, and both a bottom surface of the second well region and a bottom surface of the first well region are vertically separated from the second buried layer by a distance through the second epitaxial layer;

forming a deep trench isolation structure in the substrate and surrounding the first well region and the second well region, wherein a bottom surface of the deep trench isolation structure is lower than a bottom surface of the first buried layer;

forming a third well region surrounding the first well region and the second well region, wherein the third well region has the first conductivity type and is located between the first well region and the deep trench isolation structure, and between the second well region and the deep trench isolation structure, a bottom surface of the third well region is in contact with a top surface of the second buried layer, and the bottom surface of the third well region is lower than the bottom surface of the first well region;

forming a source region in the second well region;

forming a drain region in the first well region; and forming a gate electrode on the first well region and the second well region.

12. The method of claim 11, wherein a doping concentration of the second buried layer is equal to or lower than a doping concentration of the first buried layer.

13. The method of claim 11, wherein a thickness of the first buried layer is greater than a thickness of the second buried layer.

14. The method of claim 11, wherein both the second epitaxial layer and the first epitaxial layer have the second conductivity type, or the second epitaxial layer has the second conductivity type and the first epitaxial layer has the first conductivity type, or the second epitaxial layer has the first conductivity type and the first epitaxial layer has the second conductivity type.

15. The method of claim 11, wherein forming the deep trench isolation structure comprises:

forming a shallow trench in the second epitaxial layer;

depositing a first dielectric material layer on the second epitaxial layer and to fill up the shallow trench;

forming a deep trench to pass through the first dielectric material layer in the shallow trench, the second epitaxial layer, the second buried layer and the first buried layer, and to penetrate into the semiconductor substrate;

forming a liner on inner sidewalls and a bottom surface of the deep trench and above the first dielectric material layer;

forming a filling material layer on the liner and to fill up the deep trench;

etching back the fill material layer in the deep trench to form a lower portion of a core portion; and forming a second dielectric material layer on the liner and to fill up a remaining portion of the deep trench to form an upper portion of the core portion, wherein a remaining portion of the first dielectric material layer in the shallow trench constructs a peripheral portion surrounding the liner and the upper portion.

16. The method of claim 15, wherein forming the deep trench isolation structure further comprises:

depositing a hard mask layer on the first dielectric material layer;

forming a patterned mask on the hard mask layer;

using an etching process to etch the hard mask layer and the first dielectric material layer through an opening of the patterned mask to form an initial trench of the deep trench;

before etching back the filling material layer in the deep trench, performing a first chemical mechanical planarization (CMP) process to remove the filling material layer on the liner;

performing a second CMP process to remove the liner and the second dielectric layer on the hard mask layer;

patterning the first dielectric layer and the hard mask layer to form a protruding portion on the deep trench isolation structure; and performing a third CMP process to remove the protruding portion.

17. The method of claim 15, wherein the filling material layer comprises polysilicon.

\* \* \* \* \*